United States Patent
Shu et al.

(10) Patent No.: US 9,455,414 B2
(45) Date of Patent: Sep. 27, 2016

(54) ARRAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Shi Shu, Beijing (CN); Jingxia Gu, Beijing (CN); Chuanxiang Xu, Beijing (CN); Yonglian Qi, Beijing (CN); Qi Yao, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 15 days.

(21) Appl. No.: 14/428,847

(22) PCT Filed: May 29, 2014

(86) PCT No.: PCT/CN2014/078847
§ 371 (c)(1),
(2) Date: Mar. 17, 2015

(87) PCT Pub. No.: WO2015/096391
PCT Pub. Date: Jul. 2, 2015

(65) Prior Publication Data
US 2015/0380671 A1 Dec. 31, 2015

(30) Foreign Application Priority Data
Dec. 25, 2013 (CN) .......................... 2013 1 0728310

(51) Int. Cl.
*H01L 33/16* (2010.01)
*H01L 51/50* (2006.01)
(Continued)

(52) U.S. Cl.
CPC ....... *H01L 51/502* (2013.01); *G02F 1/133617* (2013.01); *H01L 27/12* (2013.01); *H01L 27/322* (2013.01); *H01L 27/3248* (2013.01); *H01L 27/3276* (2013.01); *H01L 51/5056* (2013.01);
(Continued)

(58) Field of Classification Search
None
See application file for complete search history.

(56) References Cited

U.S. PATENT DOCUMENTS

| 8,593,586 B2 | 11/2013 | Wang et al. |
| 2007/0007881 A1 | 1/2007 | Kim et al. |

(Continued)

FOREIGN PATENT DOCUMENTS

| CN | 102323692 A | 1/2012 |
| CN | 102929037 A | 2/2013 |

(Continued)

OTHER PUBLICATIONS

International Search Report with Notice of Transmittal of the International Search Report of PCT/CN2014/078847 in Chinese, mailed Sep. 29, 2014.
(Continued)

*Primary Examiner* — Ali Naraghi
(74) *Attorney, Agent, or Firm* — Collard & Roe, P.C.

(57) ABSTRACT

An array substrate, manufacturing method thereof and a display device are provided. The array substrate comprises thin film transistor units (2) arranged in array, and further comprises a quantum dot layer (3) disposed over the thin film transistor units (2). The quantum dot layer includes at least three kinds of quantum dots, any one kind of which emits light of a respective wave band when being irradiated and excited by light from an incident portion of the array substrate. The array substrate can improve color gamut range, transmittance of a display device without increasing the power consumption of the display device.

17 Claims, 3 Drawing Sheets

(51) Int. Cl.
*H01L 27/12* (2006.01)
*G02F 1/1335* (2006.01)
*H01L 27/32* (2006.01)
*H01L 51/52* (2006.01)
*H01L 51/56* (2006.01)
*G02F 1/017* (2006.01)
*G02F 1/1362* (2006.01)

(52) U.S. Cl.
CPC ....... *H01L 51/5072* (2013.01); *H01L 51/5209* (2013.01); *H01L 51/5225* (2013.01); *H01L 51/5284* (2013.01); *H01L 51/56* (2013.01); *G02F 2001/01791* (2013.01); *G02F 2001/136222* (2013.01); *H01L 2227/323* (2013.01); *H01L 2251/301* (2013.01)

(56) References Cited

U.S. PATENT DOCUMENTS

| | | | |
|---|---|---|---|
| 2009/0009675 A1* | 1/2009 | Cho | H01L 31/0352 349/43 |
| 2011/0037729 A1* | 2/2011 | Cho | G06F 3/0412 345/175 |
| 2011/0261294 A1 | 10/2011 | Jang et al. | |
| 2011/0291071 A1* | 12/2011 | Kim | H01L 51/502 257/13 |
| 2013/0038818 A1 | 2/2013 | Toda et al. | |

FOREIGN PATENT DOCUMENTS

| | | |
|---|---|---|
| CN | 103207476 A | 7/2013 |
| CN | 103226259 A | 7/2013 |
| CN | 103226260 A | 7/2013 |
| CN | 103278876 A | 9/2013 |
| CN | 103730472 A | 4/2014 |
| WO | 2010/056240 A1 | 5/2010 |

OTHER PUBLICATIONS

Written Opinion of the International Searching Authority of PCT/CN2014/078847 in Chinese with English translation, mailed Sep. 29, 2014.

First Chinese Office Action of Chinese Application No. 201310728310.0 with English Translation, mailed Sep. 15, 2014.

* cited by examiner

ARRAY SUBSTRATE, MANUFACTURING METHOD THEREOF, AND DISPLAY DEVICE

CROSS REFERENCE TO RELATED APPLICATIONS

This application is the National Stage of PCT/CN2014/078847 filed on May 29, 2014, which claims priority under 35 U.S.C. §119 of Chinese Application No. 201310728310.0 filed on Dec. 25, 2013, the disclosure of which is incorporated by reference.

TECHNICAL FIELD

Embodiments of the present invention relate to an array substrate, a manufacturing method thereof, and a display device.

BACKGROUND

Recently, with the development of science and technology, the technology of liquid crystal displays has been increasingly improved. Thin film transistor liquid crystal displays (TFT-LCD) play important roles in the display field due to its advantages of good image quality, low energy consumption, environmental-friend, and so on. The display technology based on an organic light-emitting diode (OLED) is getting mature in recent years, a display of this kind has a simple structure, a less thickness, a quick response, and can reproduce more colorful images.

A TFT-LCD or OLED can display a color image by using a red color filter layer, a green color filter layer and a blue color filter layer provided therein to filter white light emitted by a light source so as to converting it into monochromatic light such as red light, green light, and blue light, and respectively transmitting the respective color light through the color filter layers of different colors.

SUMMARY

One of objects of the embodiments of the present disclosure is to provide an array substrate, manufacturing method thereof, and a display device, which is capable of increasing display color gamut range and transmittance without increasing power consumption of the display device.

In order to achieve the above technical object, at least one embodiment of the present disclosure provides an array substrate comprising thin film transistor units arranged in array, the array substrate further comprising a quantum dot layer located over the thin film transistor units, the quantum dot layer comprising at least three kinds of quantum dots, and any kind of the quantum dots emitting light of a respective wave band when being irradiated and excited by light from an incident portion of the array substrate.

According to an embodiment of the present disclosure, the quantum dot layer comprises a red quantum dot region, a blue quantum dot region and a green quantum dot region.

According to an embodiment of the present disclosure, the quantum dots in the quantum dot layer is semiconductor nanocrystal composed of at least zinc atoms, cadmium atoms, selenium atoms and sulphur atoms.

According to an embodiment of the present disclosure, the array substrate, in subsequence a base substrate, a thin film transistor unit, a first insulation layer, a second insulation layer, a quantum dot layer and a first conductive layer, wherein the first insulation layer is provided with a first via, and the second insulation layer is provided with a second via, and the quantum dot layer is provided with a third via, the first via, the second via and the third via are communicated with each other so that the first conductive layer is connected to a drain electrode of the thin film transistor unit through the third via, the second via and the first via.

According to an embodiment of the present disclosure, the array substrate further comprises a color filter layer, the color filter layer is disposed farther away from an incident portion of the array substrate than the quantum dot layer, wherein the color filter layer comprises a red color filter region disposed corresponding to a red quantum dot region of the quantum dot layer, a blue color filter region disposed corresponding to a blue quantum dot region of the quantum dot layer, and a green color filter region disposed corresponding to a green quantum dot region of the quantum dot layer.

According to an embodiment of the present disclosure, the array substrate further comprises a second conductive layer and a third insulation layer disposed between the first conductive layer and the second conductive layer.

According to an embodiment of the present disclosure, the second conductive layer has a shape of slit, and the first conductive layer has a shape of plate or slit.

According to an embodiment of the present disclosure, the array substrate further comprises a fourth insulation layer, an organic layer and a third conductive layer disposed over the first conductive layer, wherein the fourth insulation layer has an opening, by which the organic layer is contacted with the first conductive layer.

According to an embodiment of the present disclosure, the organic layer comprises a hole transport layer, a light emitting layer and an electron transport layer.

According to an embodiment of the present disclosure, the array substrate further comprises a black matrix disposed over the thin film transistor unit.

In the embodiments of the present disclosure, white light supplied by the display device or other light is firstly incident into the quantum dot layer, and excites the quantum dots in the quantum dot layer to emit blend lights comprising red light, green light and blue light, after then, the blend lights are incident into the color filter layer, so that the color filter regions of different colors in the color filter layer filter monochrome lights of different colors. Since the monochrome lights emitted by the quantum dot have relative high color purity, it is unnecessary to improve the color purity of the color filter layer, and thus the color gamut range and the transmittance of the display device are improved without increasing the emitting intensity of the light source of the display device.

At least one embodiment of the present disclosure provides a display device comprising at least one of the array substrates as described above.

At least one embodiment of the present disclosure provides a method for manufacturing an array substrate, comprising:

forming patterns comprising layer structures of a thin film transistor unit on a base substrate;

forming a quantum dot layer comprising at least three kinds of quantum dots over the thin film transistor unit, wherein any one kind of the quantum dots emits light of a corresponding waveband when being irradiated by light from an incident portion of the array substrate.

In an embodiment of the present disclosure, after forming patterns comprising layer structures of a thin film transistor unit, the method further comprises:

forming a first insulation layer over the thin film transistor unit, performing a patterning process on the first insulation layer so as to form a first via corresponding to a drain of the thin film transistor unit;

forming a second insulation layer over the first insulation layer, performing a patterning process on the second insulation layer to form a protrusion corresponding to the first via; and exposing the protrusion, said forming a quantum dot layer comprising at least three kinds of quantum dots above the thin film transistor unit comprises;

forming a quantum dot layer over the second insulation layer, developing the protrusion to remove a portion of the quantum dot layer at the protrusion and a portion of the second layer below the protrusion, so as to form a third via in the quantum dot layer and a second via in the second insulation, the third via, the second via and the first via being communicated with each other; and forming a pattern comprising a first conductive layer over the quantum dot layer.

In an embodiment of the present disclosure, after the forming patterns comprising layer structures of a thin film transistor unit, the method further comprises:

forming a first insulation layer over the thin film transistor unit;

forming a second insulation layer over the first insulation layer, performing a patterning process on the second insulation layer to form a protrusion corresponding to a drain electrode of the thin film transistor unit;

exposing the protrusion;

the forming a quantum dot layer comprising at least three kinds of quantum dots over the thin film transistor unit comprises:

forming a quantum dot layer over the second insulation layer, exposing the protrusion to remove a portion of the quantum dot layer at the protrusion and a portion of the second insulation layer below the protrusion to form a third via in the quantum dot layer and a second via in the second insulation layer, the third via and the second via being communicated with each other;

forming a first via in the first insulation layer corresponding to the drain of the thin film transistor unit by using the second insulation layer as a mask, the third via, the second via and the first via being communicated with each other;

forming a pattern comprising a first conductive layer over the quantum dot layer.

In an embodiment of the present disclosure, the method for manufacturing an array substrate further comprises:

forming a color filter layer, wherein the color filter layer is disposed farther away from the incident portion of the array substrate than the quantum dot layer.

In an embodiment of the present disclosure, the method for manufacturing an array substrate further comprises forming a third insulation layer and a second conductive layer over the first conductive layer, the third insulation layer disposed between the first conductive layer and the second conductive layer.

In an embodiment of the present disclosure, the method for manufacturing an array substrate further comprises:

forming a fourth insulation layer with an opening over the first conductive layer;

forming an organic layer contacted with the first conductive layer through the opening on the fourth insulation layer; and forming a third conductive layer over the organic layer.

In an embodiment of the present disclosure, the method for manufacturing an array substrate further comprises forming a pattern comprising a black matrix over the thin film transistor unit.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The present inventor found that, in order to enlarge the color gamut range of a LCD or an OLED, it is necessary to improve the color purity of the color filter layer, which, however, would lower down the transmittance of the color filter layer. In order to guarantee the display brightness of a TFT-LCD or an OLED, it is necessary to increase light intensity output from the light source, which requires increasing the power consumption of the TFT-LCD or the OLED.

Embodiment One

Figure 1:
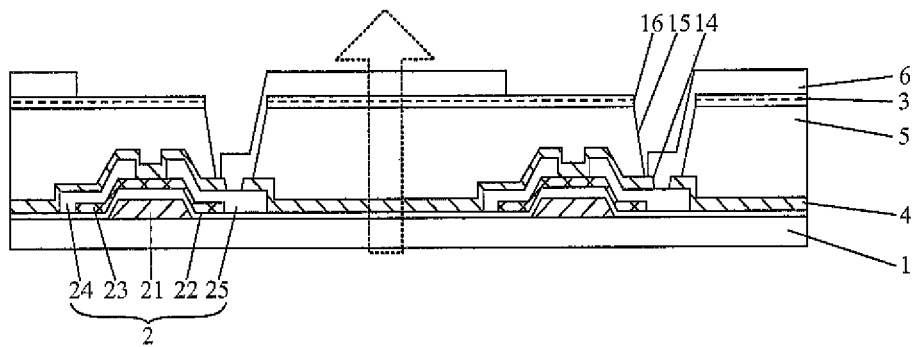
FIG. 1 is a first schematic structural view of an array substrate according to an embodiment of the present disclosure.

As illustrated in FIG. 1, at least one embodiment of the present disclosure provides an array substrate comprising thin film transistor units 2 arranged in array on a base substrate, the array substrate further comprising a quantum dot layer 3 disposed over the thin film transistor units 2, the quantum dot layer 3 comprising at least three kinds of quantum dots, any kind of the quantum dots emits light of respective wave band when being irradiated and excited by light from an incident portion of the array substrate.

The quantum dot is a semiconductor nanocrystal which is too tiny to be visible by naked eyes, the quantum dot is composed of at least zinc atoms, cadmium atoms, selenium atoms, sulphur atoms, and so on, and particles of the nanocrystal generally have sizes less than 10 nanometer. The quantum dot has a distinct feature, that is, it emits light when excited by electricity or light, generates light with pure color, which is determined by the composition, size and shape of the quantum dot. The less the size of the quantum dot is, more close to blue the light emitted upon excitation is, and the more the size of the quantum dot is, more close to red the light emitted upon excitation is. By adjusting the size of the quantum dot according to actual requirement, light of different colors can be obtained.

In the embodiment of the present disclosure, the quantum dot layer 3 comprises red quantum dots for emitting red light, green quantum dots for emitting green light, and blue quantum dots for emitting blue light. Generally, the red quantum dot has a size of 8 to 10 nm, and emits red light with a wavelength of 610 nm to 620 nm, the green quantum dot has a size of 5 to 7 nm and emits green light with a wavelength of 540 nm to 550 nm, and the blue quantum dot has a size of 3 to 5 nm and emits blue light with a wavelength of 475 nm to 485 nm. As described above, by adjusting the size of the quantum dot, the quantum dots in the embodiment of the present disclosure are enabled to emit light of respective color with narrower wavelength upon excitation, that is, the color of the respective light is relative pure.

Furthermore, in the embodiment of the present disclosure, the array substrate comprises the quantum dot layer, if a light emitting structure (e.g. a backlight source) is disposed at a side of the array substrate at the base substrate, path of the light in the array substrate is indicated in FIG. 1 by a dashed arrow. After white light is incident into the quantum dot layer, the quantum dots are excited, and accordingly, the red quantum dots emit pure red light, the green quantum dots emit pure green light, and the blue quantum dots emit pure blue light, that is to say, when the quantum dot layer 3 is excited by the white light or other light, it emits blend lights comprising the red light, the green light and the blue light.

At this time, the lights emitted by the quantum dot layer 3 are blend lights, and can not be directly used to display, and thus, it is necessary to filter the blend lights by a color filter layer on a color filter substrate. For example, the color filter layer comprises a red color filter region, a green color filter region and a blue color filter region, the red color filter region only allows the red light in the blend lights to transmit, and absorbs the green light and the blue light. Similarly, the green color filter region only allows the green light in the blend lights to transmit and absorbs the red light and the blue light, and the blue color filter region only allows the blue light in the blend lights to transmit.

It should be noted that the wavelengths of the red light, the green light and the blue light emitted by the quantum dot layer 3 when being excited are significant different, therefore, saturation and high color purity of the eventually emitted light can be guaranteed without increasing the color purity of the color filter layer on the color filter substrate. Thus the transmittance of the color filter layer can be guaranteed, and hence the display brightness of the display device can be guaranteed.

Finally, in the base substrate according to the embodiment of the present disclosure, the red color filter region emits pure red light, the green color filter region emits pure green light, and the blue color filter region emits pure blue light. Obviously, the light emitted by the substrate of the embodiment of the present disclosure has high color purity, and thus the display device comprising such a substrate can reproduce more kinds of colors, and has a broader color gamut range.

In summary, in the embodiment of the present disclosure, white light or other light supplied by the light source is firstly incident into the quantum dot layer, and excites the quantum dots in the quantum dot layer to emit blend lights comprising a red light, a green light and a blue light, then the blend lights enter into the color filter layer, to filter out the light of respective color by the respective color filter region in the color filter layer. Since the color purity of the monochromatic light emitted by the quantum dots is relative high, it is unnecessary to increase the color purity of the color filter layer, and thus the color gamut range of the display device is improved without increasing the light intensity emitted by the light source of the display device.

By taking the schematic structural view of the array substrate illustrated in FIG. 1 as an example, the structure of the array substrate is described. As illustrated in FIG. 1, the array substrate comprises in sequence a base substrate 1, a thin film transistor unit 2, a first insulation layer 4, a second insulation layer 5, a quantum dot layer 3 and a first conductive layer 6, wherein the first insulation layer 4 is provided with a first via 14, the second insulation layer 5 is provided with a second via 15, and the quantum dot layer 3 is provided with a third via 16, the first via 14, the second via 15 and the third via 16 are communicated with each other and corresponds to a drain 25 of the thin film transistor unit 1, the first conductive layer 6 is connected to the drain 25 of the thin film transistor unit 1 through the third via 16, the second via 15 and the first via 14.

The base substrate 1 can be made from a common transparent material such as glass, quartz, and so on, a gate 21 can be made of a single layer of metal such as molybdenum, aluminum, tungsten, titanium, copper and so on or by a single layer of an alloy of the above metals, or can be made by a stack of multiple layers of the above metals or alloys. Similarly, a source 24 or the drain 25 can be made by a single layer of metal such as molybdenum, aluminum, tungsten, titanium, copper and so on or by a single layer of an alloy of the above metals, or can be made by a stack of multiple layers of the above metals or alloys.

The active layer 23 can be formed by a common semiconductor material such as amorphous silicon, polycrystalline silicon, indium gallium zinc oxide, or the like, and the first conductive layer 6 can be formed by a common transparent conductive material such as indium tin oxide or indium zinc oxide.

In the structure as illustrated in FIG. 1, the first conductive layer 6 is connected to the drain 25 of the thin film transistor unit 1, and the conductive layer 6 is equivalent to a pixel electrode of the array substrate.

The first insulation layer 4 is generally also referred to as a passivation layer, and by employing a passivation layer process, not only the ability of the display device resisting harsh environments can be enhanced, but also the performance of the thin film transistor unit 1 in photoelectricity is improved. The passivation layer is generally formed by insulation material such as silicon oxide, silicon nitride, hafnium oxide, resin, and so on. The second insulation layer 5 is also referred to as a flatten layer for flattening the surface of the substrate, which facilitates subsequent processing on the array substrate.

Figure 2:
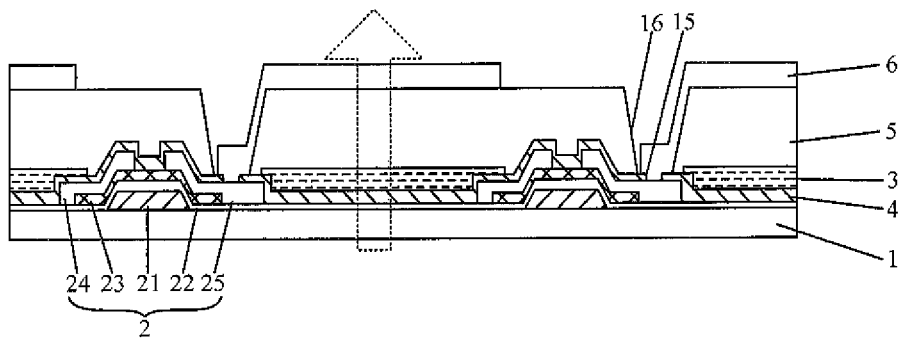
FIG. 2 is a second schematic structural view of an array substrate according to an embodiment of the present disclosure.

As illustrated in FIG. 1, the quantum dot layer 3 is disposed between the first conductive layer 6 and the second insulation layer 5, and in the embodiment of the present disclosure, the quantum dot layer 3 can also be disposed between the first insulation layer 4 and the second insulation layer 5, as illustrated in FIG. 2, or disposed between other layers of the array substrate, and there is no limitation set forth in the embodiment of the present disclosure.

Figure 3:
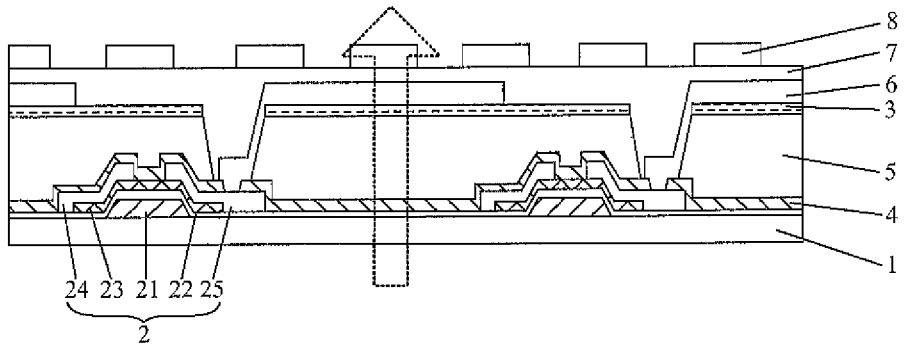
FIG. 3 is a third schematic structural view of an array substrate according to an embodiment of the present disclosure.

The array substrate in FIG. 1 or FIG. 2 is an array substrate of Twisted Nematic (TN in abbreviation) mode. The structure of the array substrate as illustrated in FIG. 1 can be changed. For example, based on the array substrate as illustrated in FIG. 1, the array substrate as illustrated in FIG. 3 further comprises a second conductive layer 8 and a third insulation layer 7 disposed between the first conductive layer 6 and the second conductive layer 8, the second conductive layer 8 cooperates with the first conductive layer 6, to collectively drive the liquid crystal molecules in the liquid crystal layer to rotate, that is, the second conductive layer 8 is a common electrode. At this time, the array substrate is an array substrate of Advanced Super Dimension Switch (ADS in abbreviation) mode based on a COA process.

As for the so-called Advanced Super Dimension Switch (ADS in abbreviation) technology, its core technical feature is described as follows: a multi-dimension field is formed with an electric field generated by edges of slit electrodes in a same plane and a electric field generated between a layer of the slit electrode layer and a layer of plate-like electrode, so as to allow liquid crystal molecules at all orientations within a liquid crystal cell, which are provided directly above the electrode and between the slit electrodes, to be rotated, thereby enhancing the work efficiency of the liquid crystals, and increasing the transmissive efficiency. The Advanced Super Dimension Switch technology can improve the picture quality of the TFT-LCD product, and has advantages such as high resolution, high transmittance, low power consumption, wide viewing angle, high aperture ratio, low chromatic aberration, push mum-free, and so on. For various application, the developed technology based on ADS technology comprises high transmittance I-ADS technology, high aperture ratio H-ADS and high resolution S-ADS technology, and so on.

Similarly, an array substrate of ADS mode can also be formed by forming a second conductive layer 8 and a third insulation layer 7 based on the structure of the array substrate as illustrated in FIG. 2, which will not be further described.

It is appreciated to those skilled in the art that the first conduction layer 6 as a pixel electrode can has a shape of plate or slit, and so does the second conductive layer 8 as a common electrode. Furthermore, although a structure in which the pixel electrode is disposed at an upper position and the common electrode is disposed at the lower position as illustrated in FIG. 1, in fact, the positions of the pixel electrode and the common electrode can be exchanged, but the upper electrode should has a shape of slit, and the lower electrode should has a shape of plate or slit.

In the technology for manufacturing the thin film transistor liquid crystal display in the early years, the color filter layer and the thin film transistor as the driving switch are formed on different substrates, and are disposed at opposite sides of the liquid crystal layer, however, with such an arrangement, the aperture ratio of the display panel will be lowered down, and thus the brightness and the picture quality of the display panel is influenced adversely. Recently, requirement on the aperture ratio and the brightness of the display panel is improved in the market, and accordingly, a technology in which a color filter layer is directly formed on an array substrate (color filter on array, COA in abbreviation) has been developed, that is, the color filter layer and the thin film transistor are formed on the same substrate, by which not only the aperture ratio of the display panel is increased and the brightness of the display panel is improved, but also problems incurred by forming the color filter layer and the thin film transistor on difference substrates are avoided.

Figure 4:
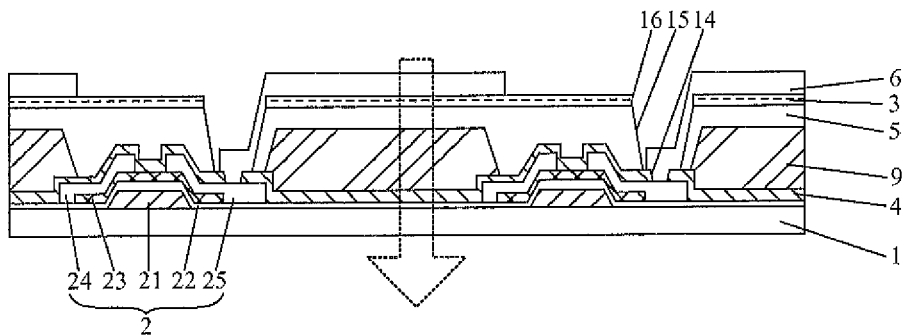
FIG. 4 is a fourth schematic structural view of an array substrate according to an embodiment of the present disclosure.
Figure 5:
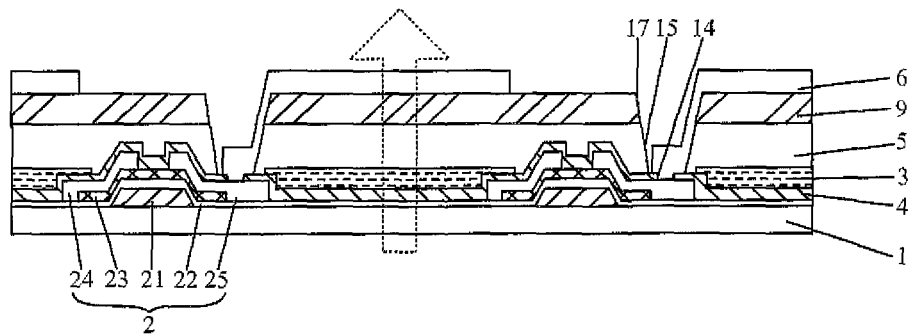
FIG. 5 is a fifth schematic structural view of an array substrate according to an embodiment of the present disclosure.

As illustrated in FIG. 4 or FIG. 5, the array substrate further comprises a color filter layer 9 disposed farther away from the incident portion of the array substrate than the quantum dot layer 3. Thus, it can be guaranteed that the light supplied by the display device is firstly incident into the quantum dot layer 3, excites the quantum dots in the quantum dot layer 3 to emit blend lights, and after that, the blend lights emitted by the quantum dots is filtered by the color filter layer 9 to provide monochromatic lights of different color to the display device for displaying.

In the embodiment of the present disclosure, the color filter layer 9 comprises a plurality of color filter regions, a region only has one color provided corresponding to a light outgoing region of the pixel unit. The light outgoing region is a region between two thin film transistor units, and as illustrated in FIG. 4, any one of the color filter regions is provided between two thin film transistor units 1.

It should be noted that in the array substrate as illustrated in FIG. 4, the light provided by the display device (as indicated in FIG. 4 by dashed arrow) is incident on the first conductive layer 6, and exits from the base substrate 1, and thus the incident light first enters the quantum dot layer 3, and then enters the color filter layer 9, that is to say, the color filter layer 9 is disposed farther away from the incident portion of the array substrate than the quantum dot layer 3. If the light supplied by the display device (as indicated in FIG. 5 by the dashed arrow) is incident on a side of the base substrate 1, and exits from a side of the first conductive layer 6, then the incident light should enter into the quantum dot layer 3 firstly and then enter into the color filter color layer 9, that is, in the array substrate as illustrated in FIG. 5, the color filter layer 9 is located farther away from the incident portion of the array substrate than the quantum clot layer 3, to guarantee the light supplied by the display device to firstly pass through the quantum dot layer 3.

Obviously, the color filter layer 9 disposed above the second insulation layer 5 in FIG. 5 should be processed so that the color filter layer 9 is provided with a fourth via 17 which is communicated with the second via 15 and the first via 14, and then the first conductive layer 6 can be connected to the drain electrode 25 through the fourth via 17, the second via 15 and the first via 14.

Figure 6:
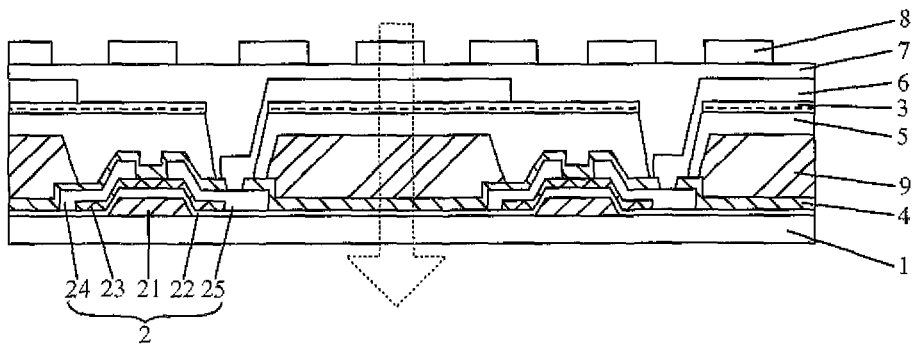
FIG. 6 is a sixth schematic structural view of an array substrate according to an embodiment of the present disclosure.

The array substrate as illustrated in FIG. 4 can also be further processed, so that a third insulation layer 7 and a second conductive layer 8 are formed on the first conductive 6, to form an ADS array substrate based on COA technology, as illustrated in FIG. 6.

In order to further increase the transmittance, in the embodiment of the present disclosure, the quantum dot layer 5 comprises a red quantum dot region, a blue quantum dot region and a green quantum dot region. Correspondingly, the color filter layer comprises a red color filter region disposed corresponding to the red quantum dot region in the quantum dot layer, a blue color filter region disposed corresponding to the blue quantum dot region in the quantum dot layer and a green color filter region provided corresponding to the green quantum dot region in the quantum dot layer. By such arrangement of the quantum dot layer, each of the quantum dot region corresponding to the color of one sub-pixel can be excited by a backlight source and emits monochromatic light, and compared with blend lights comprising the red light, the green light and the blue light, the resulted transmittance can be improved.

Figure 7:
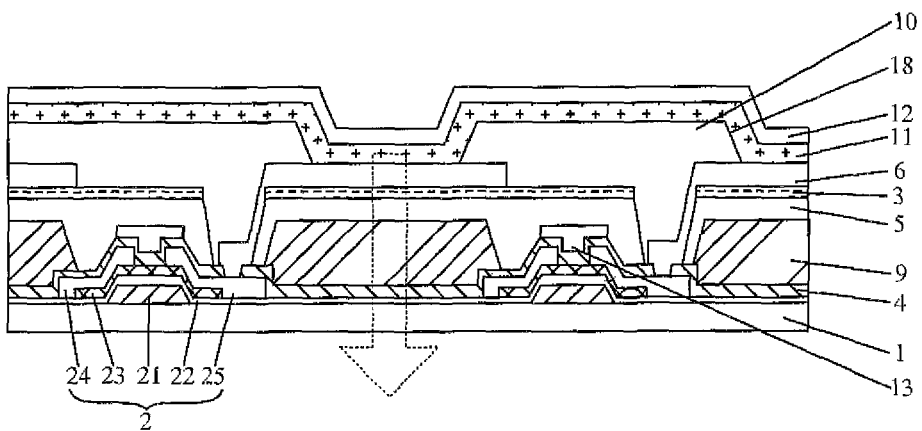
FIG. 7 is a seventh schematic structural view of an array substrate according to an embodiment of the present disclosure.

The array substrate as illustrated in FIG. 4 can be further processed. As illustrated in FIG. 7, the substrate can further comprise a fourth insulation layer 10, an organic layer 11 and a third conductive layer 12 disposed over the first conductive layer 6, the fourth insulation layer 10 has an opening 18, the organic layer 11 is connected to the first conductive layer 6 through the opening 18, the first conductive layer 6 cooperates with the third conductive layer 12 to collectively drive the organic layer 11 to emit light, so the array substrate in this case is an array substrate in Organic Light-Emitting Diode (OLED in abbreviation) mode.

The organic layer 11 comprises a hole transport layer, a light emitting layer and an electron transport layer. When there is a suitable voltage across the first conductive layer 6 and the third conductive layer 12, holes in the hole transport layer and electrons in the electron transport layer can be recombined in the light emitting layer, so that light is emitted from the light emitting layer.

It should be noted that, as the organic material suitable for transporting electrons is not always suitable for transporting holes, the electron transport layer and the hole transport layer in the OLED should adopt different organic material or the same organic material doped with different impurities. The material commonly used for forming the electron transport layer recently must has high filming stability, thermal stability, and good electron transporting ability, and a fluorescent dye compound, such as anthracene diazole derivatives, naphthalene ring-containing derivatives, 1-naphthyl, 3-methylphenyl, and so on, is commonly used. Material for the hole transport layer is a kind of aromatic amine fluorescent compound, such as 1-naphthyl and the like organic materials.

Material for the organic layer 11 has the characters of having strong fluorescent in solid state, good carrier transporting ability, thermal stability and chemical stability, high quantum efficiency, and suitable for vacuum evaporation, and for example, 8-hydroxyquinoline aluminum can be used.

Material capable of emitting white light is adopted as a material for the organic layer 11, in the embodiment of the present disclosure, low cost and opaque material such as aluminum can be adopted as the material for the third conductive layer 12 which cooperates with the first conductive layer 6 to drive the organic layer 11 to emit light, so that most of the light emitted by the organic layer 11 are substantially incident into the array substrate (as indicated in FIG. 7 by the dashed arrow), improving efficiency of the light emitted by the organic layer 11. And meanwhile, it is also possible to prevent the light emitted by the organic layer 11 from changing color after being reflected by the conductive layers, so as to guarantee the display effect of the display device.

In addition, since not the entire of the array substrate should emit light to the viewer in operation, a fourth insulation layer 10 can be disposed in a region of the first conductive layer 6 which does not need to emit light (for example, a region corresponding to the thin film transistor unit 1), so as to insulate the first conductive layer 6 from the organic layer 11, and prevent the organic layer 11 in this region from emitting light. But in a region needed to emit light, that is, a sub-pixel region, the fourth insulation layer 10 is provided with an opening 18, so that the organic layer 11 can be connected to the first conductive layer 6 through the opening 18. The fourth insulation layer 10 is also referred to as a pixel definition layer, and defines the sub pixel region to define a light emitting region. The region to which the opening 18 corresponds is the light emitting region, while a region covered by the fourth insulation layer 10 does not emit light.

It should be noted that, although the thin film transistor units 1 in the schematic views of the array substrates according to the disclosed embodiments are all bottom gate thin film transistor units, in fact, the top gate thin film transistor units can also be used, and there is no limitation set forth in the embodiments of the present disclosure.

Furthermore, at least one embodiment of the present disclosure further provides a display device comprising any one of the array substrates as described above. The display device can be any product or component with display function, for example, a liquid crystal panel, an electronic paper, an OLED panel, a liquid crystal television, a liquid crystal monitor, a digital picture frame, a mobile phone, a tablet computer, and so on.

Embodiment Two

At least one embodiment of the present disclosure further provides a method for manufacturing the array substrate as described above, the method comprises:

Step S101: forming patterns comprising layer structures of a thin film transistor unit on a base substrate;

Step 102: forming a quantum dot layer comprising at least three kinds of quantum dots on the thin film transistor unit, wherein any one kind of the quantum dots emits light of respective wave band when being excited by light from an incident portion of the array substrate.

As illustrated in FIG. 1, the thin film transistor unit 2 comprises, in sequence from bottom to top, a gate 21, a gate insulation layer 22 disposed over the gate 21, and an active layer 23 located over the gate insulation layer 22. Therefore, in manufacturing, the gate 21, the gate insulation layer 22 and the active layer 23 are subsequently formed on the base substrate.

It should be noted that, while forming the gate 21 of the thin film transistor unit 2, gate lines (not illustrated) or the like can be integrally formed on the base substrate 1.

In addition to the gate 21, the gate insulation layer 22, the active layer 23 and the like, etc, as described above, the film thin transistor unit 2 further comprises a source 21 and a drain 25. In the disclosed embodiment, the source 21 and the drain 25 are disposed in the same layer, and therefore, the source 21 can be formed at the same time as the drain 25.

If the source 21 and the drain 25 are disposed in different layers, then the source 21 can be formed before or after forming the drain according to actual requirement, there is no limitation thereon in the embodiment of the present application.

Because the thin film transistor unit 2 has a multi-layer structure as described above and at every time that one layer structure of the thin film transistor unit 2 is formed, it is necessary to place the whole array substrate in etching gas or etching liquid, if the quantum dot layer 3 is provided below the thin film transistor unit 2, then it can not be guaranteed that the quantum dot layer 3 is still kept in a good condition after being subjected to many times of erosion by the etching gas or etching liquid. Therefore, the quantum dot layer 3 should be formed after the thin film transistor unit has been completed.

Furthermore, the method will be described by taking a method for manufacturing the array substrate as illustrated in FIG. 1 as an example. In order to manufacture the array substrate illustrated in FIG. 1, between the step S101 and the step S102, the method for manufacturing the array substrate further comprises:

Step S201: forming a first insulation layer over the thin film transistor unit, and performing a patterning process on the first insulation layer to form a first via corresponding to the drain of the thin film transistor unit.

Figure 8:
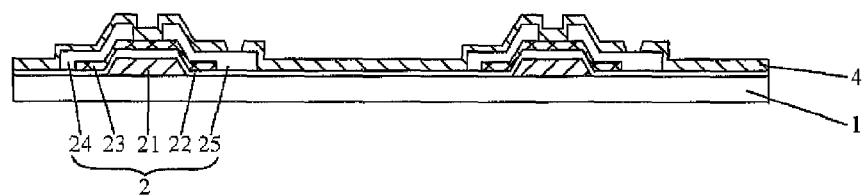
FIG. 8 is an eighth schematic structural view of an array substrate according to an embodiment of the present disclosure.

After the step S201, the array substrate as illustrated in FIG. 8 is formed.

Step 202: forming a second insulation layer over the first insulation layer and performing a patterning process on the second insulation layer to form a protrusion corresponding to the first via.

Figure 9:
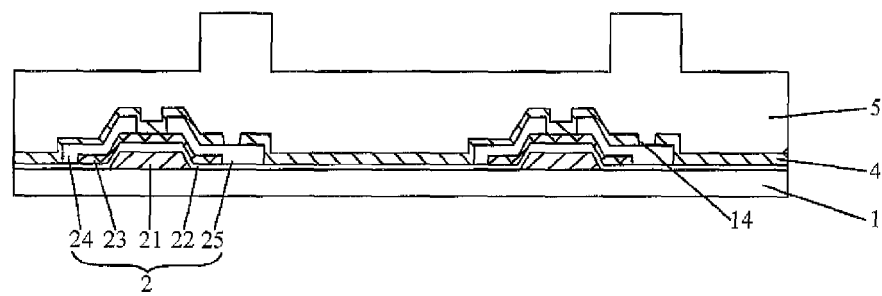
FIG. 9 is a ninth schematic structural view of an array substrate according to an embodiment of the present disclosure.

After the step S202, the array substrate as illustrated in FIG. 9 is formed.

The second insulation layer 5 can adopt positive photoresist, and is developed after being subjected to a first exposure by using a half-tone mask plate, to form the protrusion corresponding to the first via 14.

Step 203: exposing the protrusion.

The step S102 comprises:

Step 204: forming a quantum dot layer over the second insulation layer, exposing the protrusion to remove a portion of the quantum dot layer at the protrusion and a portion of the second insulation layer below the protrusion, to form a third via in the quantum dot layer and a second via in the second insulation layer, the third via, the second via and the first via being communicated with each other.

Figure 10:
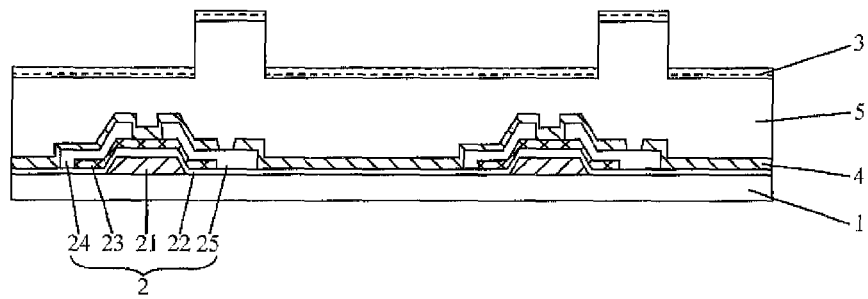
FIG. 10 is a tenth schematic structural view of an array substrate according to an embodiment of the present disclosure.
Figure 11:
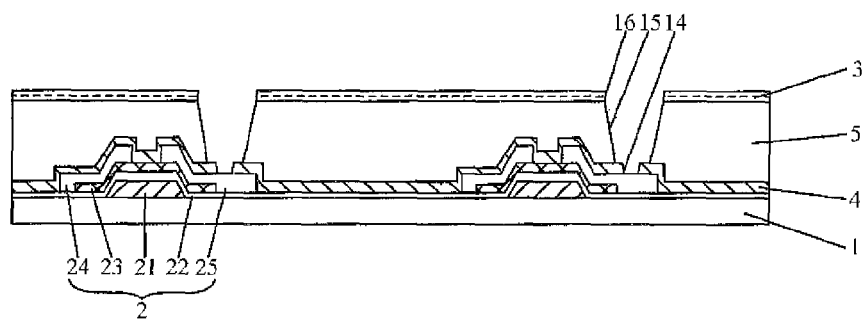
FIG. 11 is a eleventh schematic structural view of an array substrate according to an embodiment of the present disclosure.

It should be noted that as the quantum dot layer 3 can not be subjected to an etching process, in the embodiment of the present disclosure, a region corresponding to the portion of the quantum dot layer 3 to be removed, i.e. a portion of the second insulation layer 5 at the protrusion, is subjected to an exposure process, and the time period of exposure and the exposure light intensity are suitably controlled so that the second insulation layer 5 at the protrusion is all exposed. After that, the quantum dot layer 3 is formed by a method such as deposition or the like to cover the whole second insulation layer 5, as illustrated in FIG. 10. At this time, the array substrate is exposed, as the second insulation layer 5 is formed by positive photoresist, the second insulation layer 5 at the protrusion which has been subjected to the exposure process will be removed, and at the same time, a portion of the quantum dot layer 3 covering the protrusion will also be removed, so as to form the third via 16 in the quantum dot layer 3 and the second via 15 in the second insulation layer 5, as illustrated in FIG. 11.

After the step S204, the method further comprises:

Step S205: forming a pattern comprising a first conductive layer over the quantum dot layer.

Since the third via 16, the second via 15 and the first via 14 are communicated with each other, the first conductive layer 6 can be connected to the drain 25 of the thin film transistor unit 2, that is, the first conductive layer 6 is equivalent to a pixel electrode of the array substrate.

After the steps as described above, the array substrate as illustrated in FIG. 2 is formed.

In the above steps for manufacturing the array substrate, the first via 14 in the first insulation layer 4 is formed by performing a patterning process immediately after the first insulation layer 4 is formed. The first via 14 can also be formed after the second via 15 and the third via 16 by using the second insulation layer 5 as a mask, comprising the following steps:

Step S301: forming a first insulation layer over the thin film transistor unit;

Step S302: forming a second insulation layer over the first insulation layer and performing a patterning process on the second insulation layer to form a protrusion corresponding to a drain of the thin film transistor unit; and Step S303: exposing the protrusion.

The step S102 comprises:

Step S304: forming a quantum dot layer over the second insulation layer and performing exposure on the protrusion to remove a portion of the quantum dot layer at the protrusion and the second insulation layer below the protrusion, to form a third via in the quantum dot layer and a second via in the second insulation layer, the third via and a second via being communicated with each other;

Step S305, forming a first via corresponding to a drain of the thin film transistor unit in the first insulation layer by using the second insulation layer as a mask, the third via, the second via and the first via being communicated with each other; and Step S306: forming a pattern comprising a first conductive layer over the quantum dot layer.

After the above steps, the array substrate as illustrated in FIG. 2 can also be formed.

According to the method for manufacturing the array substrate as illustrated in FIG. 2, the method for manufacturing the array substrate as illustrated in FIG. 3 can be deduced. Wherein it should be noted that, as the quantum dot layer 3 in FIG. 3 is disposed between the first insulation layer 4 and the second insulation layer 5, in order to make a pattern of the quantum dot layer 3, it is necessary to perform a patterning process twice on the first insulation layer 4 by using a half tone mask, therefore, the first insulation layer 4 in this case can adopt positive photoresist. It should be noted that when performing the second exposure on the first insulation layer 4, the light intensity and period of the exposure should be controlled, so that the first insulation layer 4 can still cover the thin film transistor unit 2, data lines (not illustrated), and the like structures even after exposure.

Furthermore, a fifth insulation layer can also be formed between the first insulation layer 4 and the quantum dot layer 3, and a pattern of the quantum dot layer 3 can be formed by performing a patterning process on the fifth insulation layer, which will not be further described.

If an array substrate based on COA technology is desired, the method further comprises:

forming a color filter layer, wherein the color filter layer is disposed farther away from an incident portion of the array substrate than the quantum dot layer.

If the light supplied by the display device is incident on a side of the first conductive layer 6 of the array substrate and exits from a side of the base substrate 1, the color filter layer 9 should be disposed between the quantum dot layer 3 and the base substrate 1, as illustrated in FIG. 4. If the light supplied by the display device is incident on a side of the base substrate 1 of the array substrate, then the color filter layer 9 should be disposed over the quantum dot layer 3, as illustrated in FIG. 5.

At this time, the first via 14 in FIG. 4 can be formed before or after forming the color filter layer 9, and there is no limitation set forth in the embodiment of the present application.

Based on the array substrate as illustrated in FIG. 1, a third insulation layer 7 and a second conductive layer 8 can be formed, and the third insulation layer 7 is disposed between the first conductive layer 6 and the second conductive layer 8, to form an array substrate of ADS mode, as illustrated in FIG. 3. Obviously, the second conductive layer 8 is equivalent to a common electrode cooperating with the first conductive layer 6, as illustrated in FIG. 3.

It should be appreciated to those skilled in the art that the first conductive layer 6 as the pixel electrode can have a shape of plate or slit, and so does the second conductive layer 8 as the common electrode. Furthermore, although in FIG. 2, the pixel electrode is disposed at bottom and the common electrode is disposed at top, in fact, the positions of the pixel electrode and the common electrode can be exchanged, and the upper electrode should have a shape of slit, and the lower electrode can have a shape of plate. But, sometimes, both of the upper and lower electrodes can have a shape of slit.

Obviously, a third insulation layer 7 and a second conductive layer 8 can also be formed on the basis of the array substrates as illustrated in FIG. 2, FIG. 4 or FIG. 5, and it will not be further described.

Furthermore, the organic layer 11 or the like can be also formed on the basis of the array substrate as illustrated in FIG. 1 so as to form the array substrate in OLED mode as illustrated in FIG. 7. The method comprises:

Step S401: forming a fourth insulation layer over the first conductive layer, the fourth insulation layer having an opening;

Step S402: forming an organic layer over the fourth insulation layer, the organic layer being contacted with the first conductive layer through the opening; and Step S403: forming a third conductive layer over the organic layer.

Since the display device in OLED mode only has an array substrate and does not have an opposite substrate cell-assembled with the array substrate, it is necessary to dispose a black matrix 13 on the array substrate. For example, a pattern comprising a black matrix 13 is formed over the thin film transistor unit 2, as illustrated in FIG. 7.

It should be noted that the thin film transistor unit formed in the embodiments of the present application can be a bottom gate thin film transistor unit, and can also be a top gate thin film transistor unit, there is no limitation set forth in the embodiments of the present application.

The foregoing are merely exemplary embodiments of the invention, but are not used to limit the protection scope of the invention. The protection scope of the invention shall be defined by the attached claims.

The present disclosure claims priority of Chinese Patent Application No. 201310728310.0 filed on Dec. 25, 2013, the disclosure of which is hereby entirely incorporated by reference.

The invention claimed is:
1. An array substrate, comprising:
thin film transistor units arranged in array on a base substrate;
a quantum dot layer disposed over the thin film transistor units, the quantum dot layer comprising at least three kinds of quantum dots, any one of which emits light of a respective wave band when being irradiated and excited by light from an incident portion of the array substrate; and
further comprising in sequence, the base substrate, the thin film transistor units, a first insulation layer, a second insulation layer, the quantum dot layer and a first conductive layer, wherein the first insulation layer is provided with a first via, the second insulation layer is provided with a second via, and the quantum dot layer is provided with a third via, the first via, the second via and the third via are communicated with each other, and the first conductive layer is connected to a drain of the thin film transistor unit through the first via, the second via and the third via.

2. The array substrate according to claim 1, wherein the quantum dots in the quantum dot layer are semiconductor nanocrystal at least composed of zinc atoms, cadmium atoms, selenium atoms and sulphur atoms.

3. The array substrate according to claim 1, wherein the quantum dot layer comprises a red quantum dot region, a blue quantum dot region and a green quantum dot region.

4. The array substrate according to claim 1, further comprising a color filter layer disposed farther away from the incident portion of the array substrate than the quantum dot layer, wherein the color filter layer comprises a red color filter region disposed corresponding to the red quantum dot region of the quantum dot layer, a blue color filter region disposed corresponding to the blue quantum dot region of the quantum dot layer, and a green color filter region disposed corresponding to the green quantum dot region of the quantum dot layer.

5. The array substrate according to claim 1, further comprising a second conductive layer and a third insulation layer disposed between the first conductive layer and the second conductive layer.

6. The array substrate according to claim 5, wherein the second conductive layer has a shape of slit, and the first conductive layer has a shape of plate or slit.

7. The array substrate according to claim 1, further comprising a fourth insulation layer, an organic layer and a third conductive layer, which are disposed over the first conductive layer, wherein the fourth insulation layer is provided with an opening through which the organic layer is contacted to the first conductive layer.

8. The array substrate according to claim 7, wherein the organic layer comprises a hole transport layer, a light emitting layer and an electron transport layer.

9. The array substrate according to claim 8, further comprising a black matrix disposed over the thin film transistor units.

10. A display device comprising the array substrate according to claim 1.

11. The array substrate according to claim 2, further comprising a color filter layer disposed farther away from the incident portion of the array substrate than the quantum dot layer, wherein the color filter layer comprises a red color filter region disposed corresponding to the red quantum dot region of the quantum dot layer, a blue color filter region disposed corresponding to the blue quantum dot region of the quantum dot layer, and a green color filter region disposed corresponding to the green quantum dot region of the quantum dot layer.

12. The array substrate according to claim 3, further comprising a color filter layer disposed farther away from the incident portion of the array substrate than the quantum dot layer, wherein the color filter layer comprises a red color filter region disposed corresponding to the red quantum dot region of the quantum dot layer, a blue color filter region disposed corresponding to the blue quantum dot region of the quantum dot layer, and a green color filter region disposed corresponding to the green quantum dot region of the quantum dot layer.

13. A method for manufacturing an array substrate, comprising:
    forming a pattern comprising layer structures of thin film transistor units on a base substrate; and
    forming a quantum dot layer comprising at least three kinds of quantum dots over the thin film transistor units, wherein any kind of the quantum dots emits light of a respective wave band when being irradiated and excited by light from an incident portion of the array substrate;
    wherein after forming a pattern comprising layer structures of thin film transistor units, the method comprises:
    forming a first insulation layer over the thin film transistor units and performing an patterning process on the first insulation layer to form a first via corresponding to a drain of the thin film transistor unit;
    forming a second insulation layer over the first insulation layer and performing an patterning process on the second insulation layer to form a protrusion corresponding to the first via;
    exposing the protrusion,
    said forming a quantum dot layer comprising at least three kinds of quantum dots over the thin film transistor units comprising:
    forming a quantum dot layer over the second insulation layer, performing exposure on the protrusion to remove a portion of the quantum dot layer over the protrusion and a portion of the second insulation layer below the protrusion, to form a third via disposed in the quantum dot layer and a second via disposed in the second insulation layer, the third via, the second via and the first via being communicated with each other; and
    forming a pattern comprising a first conductive layer over the quantum dot layer, the first conductive layer being connected to the drain of the thin film transistor unit through the third via, the second via and the first via;
    or,
    forming a first insulation layer over the thin film transistor units;
    forming a second insulation layer over the first insulation layer and performing an patterning process on the second insulation layer to form a protrusion corresponding to a drain of the thin film transistor unit;
    exposing the protrusion;
    said forming a quantum dot layer comprising at least three kinds of quantum dots over the thin film transistor units comprises:
    forming a quantum dot layer over the second insulation layer and performing exposure to the protrusion to remove a portion of the quantum dot layer over the protrusion and a portion of the second insulation layer below the protrusion, to form a third via of the quantum dot layer and a second via of the second insulation layer, the third via and the second via being communicated with each other;
    by using the second insulation layer as a mask, forming a protrusion corresponding to the drain of the thin film transistor unit, the third via, the second via and the first via being communicated with each other; and
    forming a pattern comprising a first conductive layer over the quantum dot layer, the first conductive layer being connected to the drain of the thin film transistor unit through the third via, the second via and the first via.

14. The method according to claim 13, further comprising:
    forming a color filter layer, wherein the color filter layer is located farther away from the incident portion of the array substrate than the quantum dot layer.

15. The method according to claim 13, further comprising:
    forming a third insulation layer and a second conductive layer, wherein the third insulation layer is disposed between the first conductive layer and the second conductive layer.

16. The method according to claim 13, further comprising:
    forming a fourth insulation layer over the first conductive layer, the fourth insulation layer having an opening;
    forming an organic layer over the fourth insulation layer, the organic layer being contacted with the first conductive layer through the opening; and
    forming a third conductive layer over the organic layer.

17. The method according to claim 13, further comprising:
    forming a pattern comprising a black matrix over the thin film transistor units.

* * * * *